United States Patent
He et al.

(10) Patent No.: US 12,222,641 B2
(45) Date of Patent: Feb. 11, 2025

(54) METHOD AND DEVICE FOR OPTIMIZING MASK PARAMETERS

(71) Applicant: INSTITUTE OF MICROELECTRONICS, CHINESE ACADEMY OF SCIENCES, Beijing (CN)

(72) Inventors: Jianfang He, Beijing (CN); Yayi Wei, Beijing (CN); Yajuan Su, Beijing (CN); Lisong Dong, Beijing (CN); Libin Zhang, Beijing (CN); Rui Chen, Beijing (CN); Le Ma, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/773,668

(22) PCT Filed: Nov. 8, 2021

(86) PCT No.: PCT/CN2021/129295
§ 371 (c)(1),
(2) Date: May 2, 2022

(87) PCT Pub. No.: WO2023/070738
PCT Pub. Date: May 4, 2023

(65) Prior Publication Data
US 2024/0176228 A1 May 30, 2024

(30) Foreign Application Priority Data
Oct. 29, 2021 (CN) .......................... 202111274722.2

(51) Int. Cl.
G03F 1/70 (2012.01)
G03F 1/44 (2012.01)
G03F 7/00 (2006.01)

(52) U.S. Cl.
CPC .................. *G03F 1/44* (2013.01); *G03F 1/70* (2013.01)

(58) Field of Classification Search
CPC ..... G03F 1/44; G03F 1/70; G03F 1/00; G03F 7/705
See application file for complete search history.

(56) References Cited

U.S. PATENT DOCUMENTS

2011/0179393 A1* 7/2011 Xue .................. G03F 7/705
716/55
2018/0314148 A1* 11/2018 Tetiker ................ H01J 37/3244

\* cited by examiner

*Primary Examiner* — Nghia M Doan
(74) *Attorney, Agent, or Firm* — Scully, Scott, Murphy & Presser, P.C.

(57) ABSTRACT

The present disclosure provides a method for optimizing mask parameters, and the method includes: acquiring a test pattern, light source parameters, and initial mask parameters, the initial mask parameters including a mask thickness and an initial mask sidewall angle; generating multiple sets of candidate mask parameters according to the initial mask sidewall angle in the initial mask parameters; the multiple sets of candidate mask parameters including different mask sidewall angles and the same mask thickness; obtaining an imaging contrast of each set of candidate mask parameters based on the test pattern and the light source parameters; and selecting an optimal mask sidewall angle from the multiple sets of candidate mask parameters according to the imaging contrasts. By generating multiple sets of candidate mask parameters including different mask sidewall angles and the same mask thickness, and simulating these sets of candidate mask parameters respectively, the imaging contrast of each set of candidate mask parameters is obtained, so that the optimal mask sidewall angle is found according to the (Continued)

imaging contrasts. Therefore, by optimizing the mask parameters of the multi-layer film lens structure, the imaging contrast can also be significantly improved, and the imaging resolution can be improved.

8 Claims, 3 Drawing Sheets

METHOD AND DEVICE FOR OPTIMIZING MASK PARAMETERS

TECHNICAL FIELD

The present disclosure relates to the technical field of semiconductor, and in particular to a method and a device for optimizing mask parameters.

BACKGROUND

In the semiconductor field, traditional lithography technology generally achieves the preparation of patterns with a smaller characteristic size by continuously reducing the exposure wavelength and increasing the numerical aperture. However, due to the limitation and restriction of diffraction limit, there remain obstacles that are difficult to break through. Surface plasmons can use a specially designed metal thin film to couple and transmit evanescent waves to achieve the imaging of fine structures of objects with a characteristic size far smaller than the order of wavelength. This provides a feasible method for breaking through the optical diffraction limit and performing optical field manipulation.

At present, a metal-dielectric multi-layer film lens structure based on plasma is used. In order to improve the imaging resolution, people mainly improve structural parameters of the multi-layer film lens structure so that the imaging resolution of the multi-layer film lens structure is improved, thus improving the imaging contrast.

However, there is no relevant research on the optimization of mask parameters related to the multi-layer film lens structure.

SUMMARY

An object of the present disclosure is to propose a method and a device for optimizing mask parameters in view of the above shortcomings in the prior art, and the object is achieved through the following technical solutions.

A first aspect of the present disclosure provides a method for optimizing mask parameters, and the method includes:
  acquiring a test pattern, light source parameters, and initial mask parameters, the initial mask parameters including a mask thickness and an initial mask sidewall angle;
  generating multiple sets of candidate mask parameters according to the initial mask sidewall angle in the initial mask parameters; the multiple sets of candidate mask parameters including different mask sidewall angles and the same mask thickness;
  obtaining an imaging contrast of each set of candidate mask parameters based on the test pattern and the light source parameters; and
  selecting an optimal mask sidewall angle from the multiple sets of candidate mask parameters according to the imaging contrasts.

Preferably, the generating multiple sets of candidate mask parameters according to the initial mask sidewall angle in the initial mask parameters includes: starting from the initial mask sidewall angle, generating one mask sidewall angle every other preset step until the generated mask sidewall angle is larger than a preset sidewall angle; and forming each generated mask sidewall angle and the mask thickness into a set of candidate mask parameters.

Preferably, the obtaining an imaging contrast of each set of candidate mask parameters based on the test pattern and the light source parameters includes: for each set of candidate mask parameters, under the condition of the set of candidate mask parameters, obtaining a maximum light intensity and a minimum light intensity of an aerial image formed in a photoresist coated on a base layer by using the test pattern and the light source parameters; and determining the imaging contrast of the set of candidate mask parameters according to the maximum light intensity and the minimum light intensity.

Preferably, the selecting an optimal mask sidewall angle from the multiple sets of candidate mask parameters according to the imaging contrasts includes: determining the mask sidewall angle in the candidate mask parameters corresponding to a maximum value of the imaging contrast, as the optimal mask sidewall angle.

A second aspect of the present disclosure provides a device for optimizing mask parameters, which includes:
  an acquisition module, which is configured to acquire a test pattern, light source parameters, and initial mask parameters, the initial mask parameters including a mask thickness and an initial mask sidewall angle;
  a candidate parameter generation module, which is configured to generate multiple sets of candidate mask parameters according to the initial mask sidewall angle in the initial mask parameters; the multiple sets of candidate mask parameters including different mask sidewall angles and the same mask thickness;
  a simulation module, which is configured to obtain an imaging contrast of each set of candidate mask parameters based on the test pattern and the light source parameters; and
  an optimal value selection module, which is configured to select an optimal mask sidewall angle from the multiple sets of candidate mask parameters according to the imaging contrasts.

Preferably, the candidate parameter generation module is specifically configured to: starting from the initial mask sidewall angle, generate one mask sidewall angle every other preset step until the generated mask sidewall angle is larger than a preset sidewall angle; and form each generated mask sidewall angle and the mask thickness into a set of candidate mask parameters.

Preferably, the simulation module is specifically configured to: for each set of candidate mask parameters, under the condition of the set of candidate mask parameters, obtain a maximum light intensity and a minimum light intensity of an aerial image formed in a photoresist coated on a base layer by using the test pattern and the light source parameters; and determine the imaging contrast of the set of candidate mask parameters according to the maximum light intensity and the minimum light intensity.

Preferably, the optimal value selection module is specifically configured to: determine the mask sidewall angle in the candidate mask parameters corresponding to a maximum value of the imaging contrast, as the optimal mask sidewall angle.

Based on the method and device for optimizing mask parameters described in the above first and second aspects, the present disclosure has at least the following beneficial effects or advantages.

By generating multiple sets of candidate mask parameters including different mask sidewall angles and the same mask thickness, and simulating these sets of candidate mask parameters respectively, the imaging contrast of each set of candidate mask parameters is obtained, so that the optimal mask sidewall angle is found according to the imaging contrasts. Therefore, by optimizing the mask parameters of the multi-layer film lens structure, the imaging contrast can also be significantly improved, and the imaging resolution can be improved.

BRIEF DESCRIPTION OF THE DRAWINGS

The accompanying drawings described herein are used to provide a further understanding of the present disclosure, and they constitute a part of the present disclosure. Exemplary embodiments of the present disclosure and the description thereof are used to explain the present disclosure, and do not impose improper limitations to the present disclosure. In the drawings.

DETAILED DESCRIPTION

Figure 1:
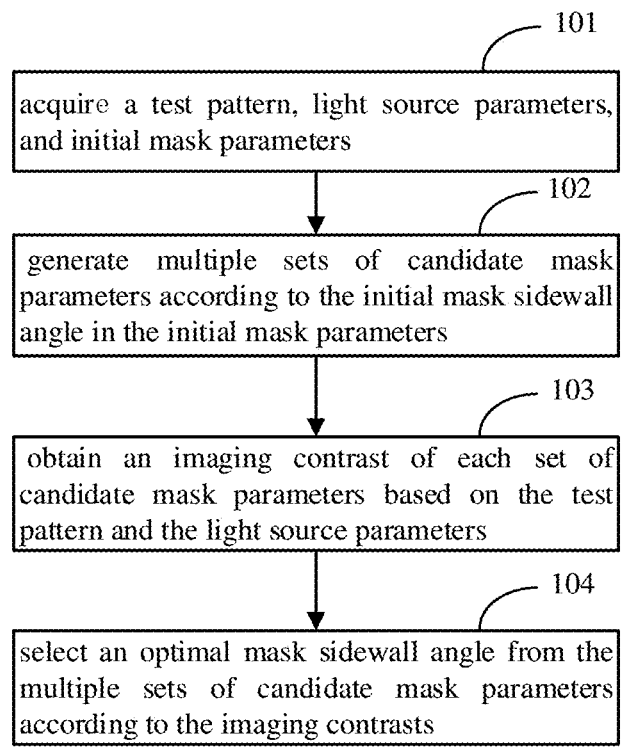
FIG. 1 is a flowchart of an embodiment of a method for optimizing mask parameters according to an exemplary embodiment of the present disclosure.

Exemplary embodiments will be described in detail herein, and examples thereof are shown in the accompanying drawings. When the following description involves the drawings, the same numbers in different drawings indicate the same or similar elements, unless otherwise indicated. The implementations described in the following exemplary embodiments do not represent all the implementations consistent with the present disclosure. On the contrary, they are merely examples of devices and methods consistent with some aspects of the present disclosure as set forth in detail in the appended claims.

Terms used in the present disclosure are only for the purpose of describing specific embodiments, and are not intended to limit the present disclosure. The singular forms of "a", "said" and "the" used in the present disclosure and the appended claims are also intended to include plural forms, unless the context clearly indicates other meanings. It should also be understood that the term "and/or" as used herein refers to and includes any or all possible combinations of one or more associated listed items.

It should be understood that although the terms "first", "second", "third" and the like may be used in the present disclosure to describe various information, the information should not be limited by these terms. These terms are only used to distinguish the same type of information from each other. For example, without departing from the scope of the present disclosure, first information may also be referred to as second information, and similarly, second information may also be referred to as first information. Depending on the context, the word "if" as used herein may be interpreted as "when . . . " or "at the time of . . . " or "determined in response to . . . ".

In the prior art, super-diffraction imaging is achieved by using super lens imaging. Due to optical characteristics of the negative refractive index, this lens can couple and transmit high-frequency spectrum evanescent wave components, thus achieving the effect of super-diffraction optical imaging. In recent years, extensive research and progress have been made on super-diffraction imaging in terms of breaking through the optical limit and improving the imaging resolution.

A series of scientific research activities concerning the influence of structure and material parameters on the imaging quality of the super lens, such as metal loss, film thickness and roughness, illumination form, time domain characteristics of the light, bandwidth characteristics, and metal reflective layer, are carried out one by one. People have made a lot of research mainly on the lens part of the super-diffraction imaging system, that is, the metal-medium multi-layer film lens structure, to improve and optimize the structural parameters of the super-diffraction lens, so that the imaging resolution of the structure is improved and the imaging contrast is also greatly improved.

However, there is currently no relevant research on the optimization of mask parameters closely related to the imaging structure.

In view of the above, the present application proposes a method for optimizing mask parameters, in which: a test pattern, light source parameters, and initial mask parameters are acquired, where the initial mask parameters include a mask thickness and an initial mask sidewall angle; then multiple sets of candidate mask parameters are generated according to the initial mask sidewall angle in the initial mask parameters, where the multiple sets of candidate mask parameters include different mask sidewall angles and the same mask thickness; an imaging contrast of each set of candidate mask parameters is obtained based on the test pattern and the light source parameters; and finally, an optimal mask sidewall angle is selected from the multiple sets of candidate mask parameters according to the imaging contrasts.

Based on the above description, the solution of the present application has the following beneficial effects.

By generating multiple sets of candidate mask parameters including different mask sidewall angles and the same mask thickness, and simulating these sets of candidate mask parameters respectively, the imaging contrast of each set of candidate mask parameters is obtained, so that the optimal mask sidewall angle is found according to the imaging contrasts. Therefore, by optimizing the mask parameters of the multi-layer film lens structure, the imaging contrast can also be significantly improved, and the imaging resolution can be improved.

FIG. 1 is a flowchart of an embodiment of a method for optimizing mask parameters according to an exemplary embodiment of the present disclosure. In the embodiment of the present application, the mask parameters of the multi-layer film lens structure (specifically, the mask sidewall angle) are optimized, so as to improve the imaging contrast and resolution of the lens structure. As shown in FIG. 1, the method for optimizing mask parameters includes the following steps 101 to 104.

Step 101: acquiring a test pattern, light source parameters, and initial mask parameters.

The light source parameters may be that 365 nm TM polarized light is incident on a mask surface under off-axis illumination condition.

Figure 2:
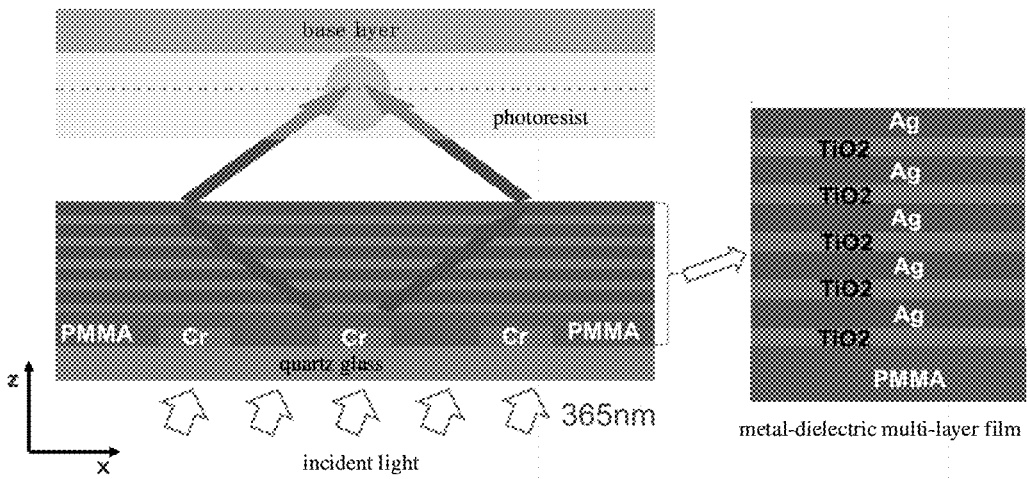
FIG. 2 is a schematic diagram of an imaging structure of a multi-layer film lens structure composed of alternate metal-medium according to the embodiment of the present disclosure as shown in FIG. 1.

The multi-layer film lens structure used in the present disclosure is specifically a multi-layer film structure composed of alternate metal-medium. As shown in FIG. 2, the mask pattern (i.e., the test pattern) is a chromium (Cr) mask and is made on quartz glass, with a slit width being 150 nm and a period being 300 nm. The entire multi-layer film structure includes five pairs of silver (Ag)/TiO$_2$ composite films of equal thickness; each layer has a thickness of 30 nm, and a total thickness is 300 nm. For the processing, a layer of polymethyl methacrylate (PMMA) material with a thickness of 150 nm and matching the real part of the dielectric constant of the Ag film is covered on the mask to fill up the slits in the Cr mask.

A thickness of photoresist on a base layer shown in FIG. 2 is 50 nm.

Figure 3:
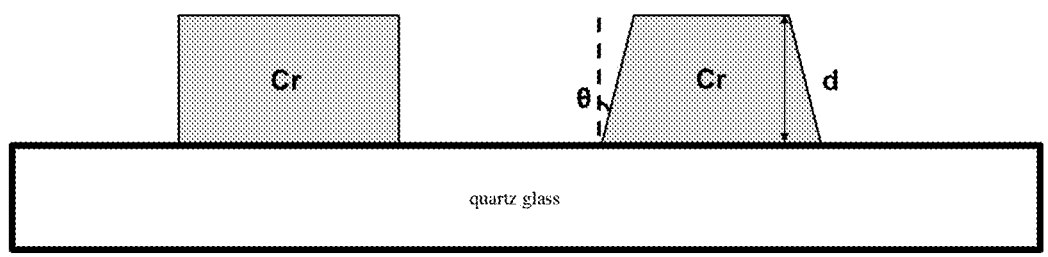
FIG. 3 is a schematic diagram of mask sidewall angle parameters according to the embodiment of the present disclosure as shown in FIG. 1.

The mask parameters include a mask thickness d and a mask sidewall angle θ. As shown in FIG. 3, the mask thickness d in the mask pattern used in the present disclosure is 60 nm, and an initial mask sidewall angle θ=0°.

Step 102: generating multiple sets of candidate mask parameters according to the initial mask sidewall angle in the initial mask parameters.

In the prior art, the mask sidewall angle used is a perpendicular sidewall angle, that is θ=0°. In order to optimize the mask sidewall angle, the mask sidewall angle used is changed to an inclined sidewall angle (larger than 0°) in the present disclosure.

In an optional specific embodiment, starting from the initial mask sidewall angle, one mask sidewall angle may be generated every other preset step until the generated mask sidewall angle is larger than a preset sidewall angle, and then each generated mask sidewall angle and the mask thickness are formed into a set of candidate mask parameters.

Exemplarily, a range of the mask sidewall angle that needs to be optimized is set to 0°-50°, and the step is set to 2°, so the mask sidewall angles of 2°, 4°, 6° . . . 50° may be generated in sequence.

During the simulation, the mask thickness used does not change, so multiple sets of candidate mask parameters including different mask sidewall angles and the same mask thickness can be generated.

Step 103: obtaining an imaging contrast of each set of candidate mask parameters based on the test pattern and the light source parameters.

In an optional specific embodiment, for each set of candidate mask parameters, under the condition of the set of candidate mask parameters, a maximum light intensity and a minimum light intensity of an aerial image formed in a photoresist coated on a base layer are obtained by using the test pattern and the light source parameters; and the imaging contrast of the set of candidate mask parameters is determined according to the maximum light intensity and the minimum light intensity.

By using software (FDTD solutions), the maximum light intensity and the minimum light intensity of the aerial image formed in the photoresist coated on the base layer after the incident light passes through the multi-layer film lens structure and arrives at the base layer can be modeled and simulated.

Preferably, since the light is usually specifically focused to a middle position of the photoresist, the maximum light intensity and the minimum light intensity of the aerial image formed at an imaging position in the photoresist (i.e., the middle position) can be obtained.

Specifically, the formula of calculating the imaging contrast is:

$$C = (I_{max} - I_{min})/(I_{max} + I_{min});$$

where C represents the imaging contrast, $I_{max}$ represents the maximum light intensity, and $I_{min}$ represents the minimum light intensity.

Step 104: selecting an optimal mask sidewall angle from the multiple sets of candidate mask parameters according to the imaging contrasts;

where the higher the imaging contrast is, the better the corresponding mask parameters will be.

Based on this, the mask sidewall angle in the candidate mask parameters corresponding to a maximum value of the imaging contrast may be determined as the optimal mask sidewall angle.

Figure 4:
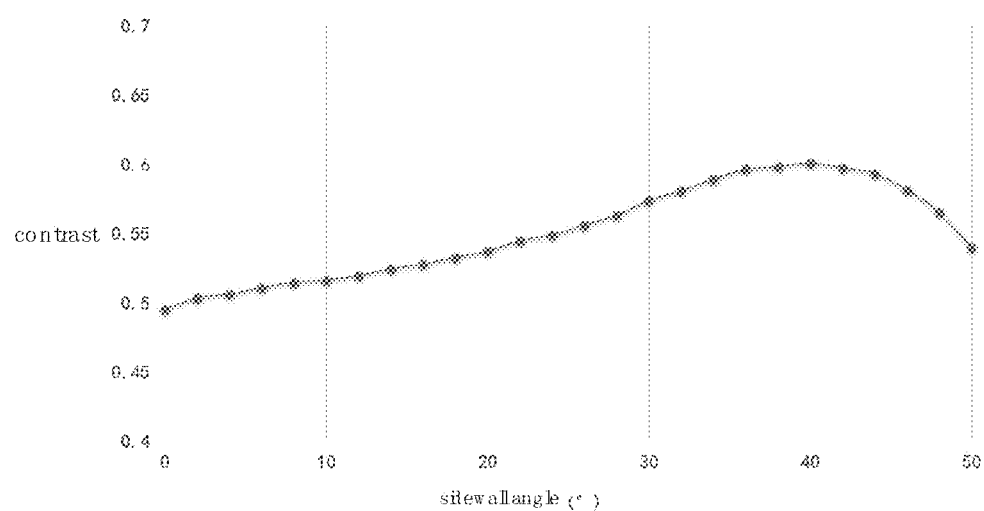
FIG. 4 is a schematic diagram of a curve showing a change of an imaging contrast with the mask sidewall angle according to the embodiment of the present disclosure as shown in FIG. 1.

FIG. 4 shows a curve of a change of the imaging contrast with the mask sidewall angle when the mask sidewall angle is in a range of 0-50°. It can be seen from FIG. 4 that the optimal mask sidewall angle is 40°.

Figure 5:
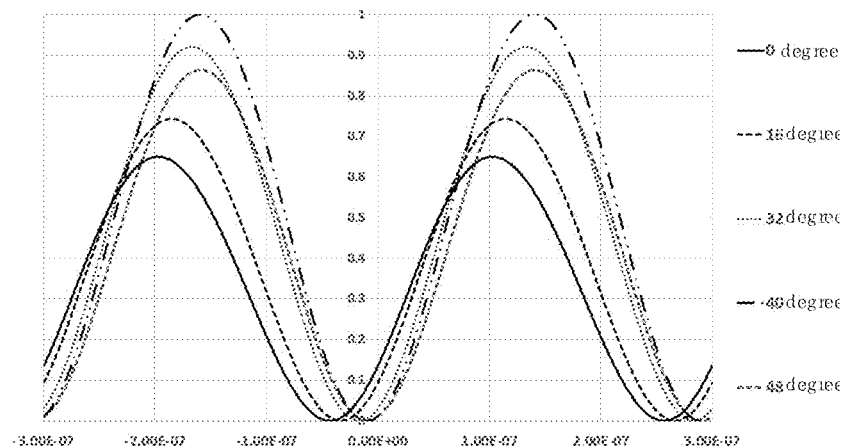
FIG. 5 is a schematic diagram showing a comparison of light intensity curves of an aerial image formed in a photoresist by different mask sidewall angles according to the embodiment of the present disclosure as shown in FIG. 1.

FIG. 5 further shows light intensity curves of the aerial image with the mask sidewall angle being 0°, 16°, 32°, 40°, and 48° respectively. The horizontal axis represents a horizontal position on the same layer of the photoresist, and the vertical axis represents the light intensity. It can be seen from FIG. 5 that the light intensity curve with a mask sidewall angle of 40° has the largest amplitude, which indicates the highest imaging contrast. Therefore, it can also be concluded that 40° is the optimal mask sidewall angle.

Now, the optimization process shown in FIG. 1 is completed. By generating multiple sets of candidate mask parameters including different mask sidewall angles and the same mask thickness, and simulating these sets of candidate mask parameters respectively, the imaging contrast of each set of candidate mask parameters is obtained, so that the optimal mask sidewall angle is found according to the imaging contrasts. Therefore, by optimizing the mask parameters of the multi-layer film lens structure, the imaging contrast can also be significantly improved, and the imaging resolution can be improved.

Figure 6:
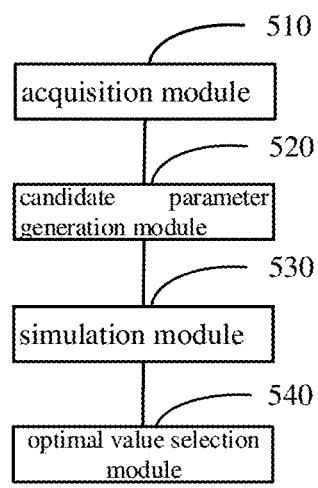
FIG. 6 is a schematic structural diagram of a device for optimizing mask parameters according to an exemplary embodiment of the present disclosure.

FIG. 6 is a schematic structural diagram of a device for optimizing mask parameters according to an exemplary embodiment of the present disclosure, and the device includes:

an acquisition module 510, which is configured to acquire a test pattern, light source parameters, and initial mask parameters, the initial mask parameters including a mask thickness and an initial mask sidewall angle;

a candidate parameter generation module 520, which is configured to generate multiple sets of candidate mask parameters according to the initial mask sidewall angle in the initial mask parameters; the multiple sets of candidate mask parameters including different mask sidewall angles and the same mask thickness;

a simulation module 530, which is configured to obtain an imaging contrast of each set of candidate mask parameters based on the test pattern and the light source parameters; and an optimal value selection module 540, which is configured to select an optimal mask sidewall angle from the multiple sets of candidate mask parameters according to the imaging contrasts.

In an optional implementation, the candidate parameter generation module 520 is specifically configured to: starting from the initial mask sidewall angle, generate one mask sidewall angle every other preset step until the generated mask sidewall angle is larger than a preset sidewall angle; and form each generated mask sidewall angle and the mask thickness into a set of candidate mask parameters.

In an optional implementation, the simulation module 530 is specifically configured to: for each set of candidate mask parameters, under the condition of the set of candidate mask parameters, obtain a maximum light intensity and a minimum light intensity of an aerial image formed in a photoresist coated on a base layer by using the test pattern and the light source parameters; and determine the imaging contrast of the set of candidate mask parameters according to the maximum light intensity and the minimum light intensity.

In an optional implementation, the optimal value selection module 540 is specifically configured to: determine the mask sidewall angle in the candidate mask parameters corresponding to a maximum value of the imaging contrast, as the optimal mask sidewall angle.

For the specific implementation process of the functions and roles of individual units in the above-mentioned device, reference may be made to the implementation process of the corresponding steps in the above-mentioned method for details, and a repeated description is omitted herein.

For the device embodiment, since it basically corresponds to the method embodiment, for relevant parts, reference may be made to the parts of the description of the method embodiment. The device embodiment described above is merely illustrative, the units described as separate components may be or may not be physically separated, and the components displayed as units may be or may not be physical units, that is, they may be located in one place, or they may be distributed over multiple network units. Some or all of the modules may be selected according to actual needs to achieve the objects of the solutions of the present disclosure. Those skilled in the art can understand and implement them without creative work.

Those skilled in the art will easily think of other embodiments of the present disclosure after considering the specification and practicing the present disclosure disclosed herein. The present disclosure is intended to cover any variations, uses or adaptive changes of the present disclosure. These variations, uses or adaptive changes follow the general principles of the present disclosure and include common knowledge or conventional technical means in the technical field that are not disclosed by the present disclosure. The specification and the embodiments should be regarded as exemplary only, and the true scope and spirit of the present disclosure are indicated by the appended claims.

It should also be noted that the terms "include", "contain" or any other variants thereof are intended to cover non-exclusive inclusion, so that a process, method, commodity or device including a series of elements not only include those elements, but also include other elements that are not explicitly listed, or they also include elements inherent to such process, method, commodity, or device. If there are no further restrictions, the element defined by the sentence "including a . . . " does not exclude the existence of other identical elements in the process, method, commodity, or device that includes the element.

Described above are only preferred embodiments of the present disclosure and are not intended to limit the present disclosure. Any modifications, equivalent replacements, improvements, etc., made within the spirit and principle of the present disclosure shall be included within the scope of protection of the present disclosure.

The invention claimed is:

1. A method for optimizing mask parameters, the method comprising:
   acquiring a test pattern, light source parameters, and initial mask parameters, the initial mask parameters comprising a mask thickness and an initial mask sidewall angle;
   generating multiple sets of candidate mask parameters according to the initial mask sidewall angle in the initial mask parameters; wherein the multiple sets of candidate mask parameters comprising different mask sidewall angles and the same mask thickness;
   obtaining an imaging contrast of each set of candidate mask parameters based on the test pattern and the light source parameters; and
   selecting an optimal mask sidewall angle from the multiple sets of candidate mask parameters according to the imaging contrasts.

2. The method according to claim 1, wherein the generating multiple sets of candidate mask parameters according to the initial mask sidewall angle in the initial mask parameters comprises:
   starting from the initial mask sidewall angle, generating one mask sidewall angle every other preset step until the generated mask sidewall angle is larger than a preset sidewall angle; and
   forming each generated mask sidewall angle and the mask thickness into a set of candidate mask parameters.

3. The method according to claim 1, wherein the obtaining an imaging contrast of each set of candidate mask parameters based on the test pattern and the light source parameters comprises:
   for each set of candidate mask parameters, under the condition of the set of candidate mask parameters, obtaining a maximum light intensity and a minimum light intensity of an aerial image formed in a photoresist coated on a base layer by using the test pattern and the light source parameters; and
   determining the imaging contrast of the set of candidate mask parameters according to the maximum light intensity and the minimum light intensity.

4. The method according to claim 1, wherein the selecting an optimal mask sidewall angle from the multiple sets of candidate mask parameters according to the imaging contrasts comprises:
   determining the mask sidewall angle in the candidate mask parameters corresponding to a maximum value of the imaging contrast, as the optimal mask sidewall angle.

5. A device for optimizing mask parameters, the device comprising:
   an acquisition module, which is configured to acquire a test pattern, light source parameters, and initial mask parameters, the initial mask parameters comprising a mask thickness and an initial mask sidewall angle;
   a candidate parameter generation module, which is configured to generate multiple sets of candidate mask parameters according to the initial mask sidewall angle in the initial mask parameters; wherein the multiple sets of candidate mask parameters comprising different mask sidewall angles and the same mask thickness;
   a simulation module, which is configured to obtain an imaging contrast of each set of candidate mask parameters based on the test pattern and the light source parameters; and an optimal value selection module, which is configured to select an optimal mask sidewall angle from the multiple sets of candidate mask parameters according to the imaging contrasts.

6. The device according to claim 5, wherein the candidate parameter generation module is specifically configured to: starting from the initial mask sidewall angle, generate one mask sidewall angle every other preset step until the generated mask sidewall angle is larger than a preset sidewall angle; and form each generated mask sidewall angle and the mask thickness into a set of candidate mask parameters.

7. The device according to claim 5, wherein the simulation module is specifically configured to: for each set of candidate mask parameters, under the condition of the set of candidate mask parameters, obtain a maximum light intensity and a minimum light intensity of an aerial image formed in a photoresist coated on a base layer by using the test pattern and the light source parameters; and determine the imaging contrast of the set of candidate mask parameters according to the maximum light intensity and the minimum light intensity.

8. The device according to claim 5, wherein the optimal value selection module is specifically configured to: determine the mask sidewall angle in the candidate mask parameters corresponding to a maximum value of the imaging contrast, as the optimal mask sidewall angle.

* * * * *